United States Patent [19]

Bloomer et al.

[11] 4,360,847
[45] Nov. 23, 1982

[54] DIODE ASSISTED RELAY CONTACTOR

[75] Inventors: Milton D. Bloomer, Scotia; Joseph L. Ciccone, Albany; John D. Harnden, Jr.; William P. Kornrumpf, both of Schenectady; Donald P. Shattuck, Scotia, all of N.Y.

[73] Assignee: General Electric Company, Schenectady, N.Y.

[21] Appl. No.: 222,410

[22] Filed: Jan. 5, 1981

[51] Int. Cl.$^3$ ............................................. H02H 3/00
[52] U.S. Cl. ........................................ 361/3; 361/8; 361/13
[58] Field of Search ................... 361/3, 8, 11, 13, 58, 361/76, 77

[56] References Cited

U.S. PATENT DOCUMENTS

| | | | |
|---|---|---|---|
| 3,395,316 | 7/1968 | Denes et al. | 317/11 |
| 3,446,991 | 5/1969 | Howell | 307/252 |
| 3,466,503 | 9/1969 | Goldberg | 317/11 |
| 3,504,233 | 3/1970 | Hurtle | 317/11 |
| 3,736,466 | 5/1973 | Fox et al. | 317/11 A |
| 4,152,634 | 5/1979 | Penrod | 318/739 |
| 4,296,449 | 10/1981 | Eichelberger | 361/3 |

Primary Examiner—Reinhard J. Eisenzopf
Attorney, Agent, or Firm—Geoffrey H. Krauss; James C. Davis, Jr.; Marvin Snyder

[57] ABSTRACT

A switching circuit having hybrid contactors connects the three output lines of a 3 phase AC power source to three input lines of a load, such as a motor and the like. A single pair of relay contacts is used to directly connect one output line of the AC power source to one input line of the load, whereas each of the other two phases of the AC power source are supplied to the load by one of a pair of pilot relay contacts in series with a diode-shunted one of a pair of master relay contacts. Only two extra pilot relays are used to provide a reversing function. The switching circuit further includes a zero-crossing detector, a phase-sequence detector, a control circuit including four flip-flops arranged in a tumble-down chain and a single distribution circuit having a data select circuit. The control circuit causes the making and breaking of the contacts at particular times, and in a sequence, such that arcing is prevented.

25 Claims, 4 Drawing Figures

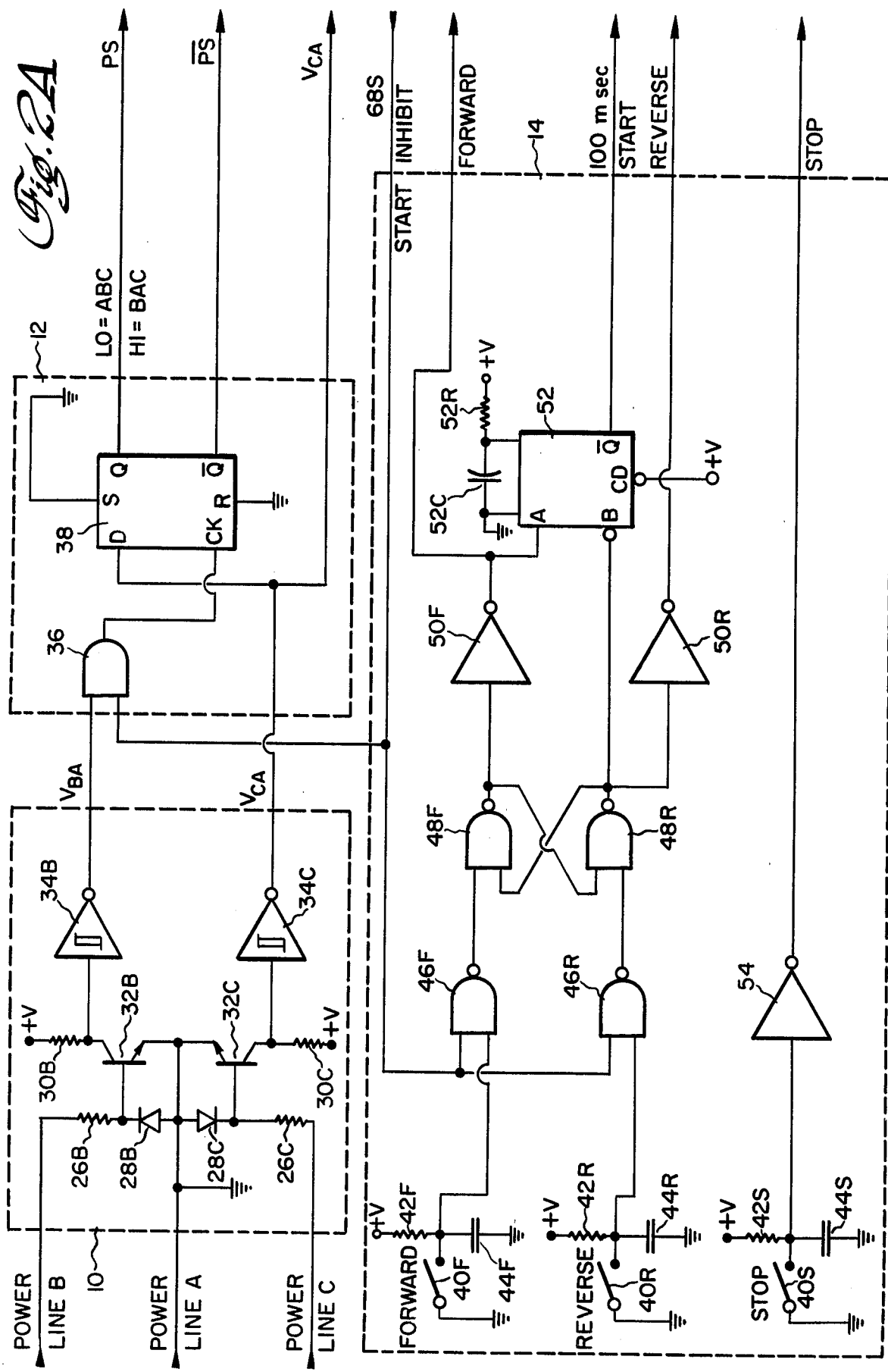

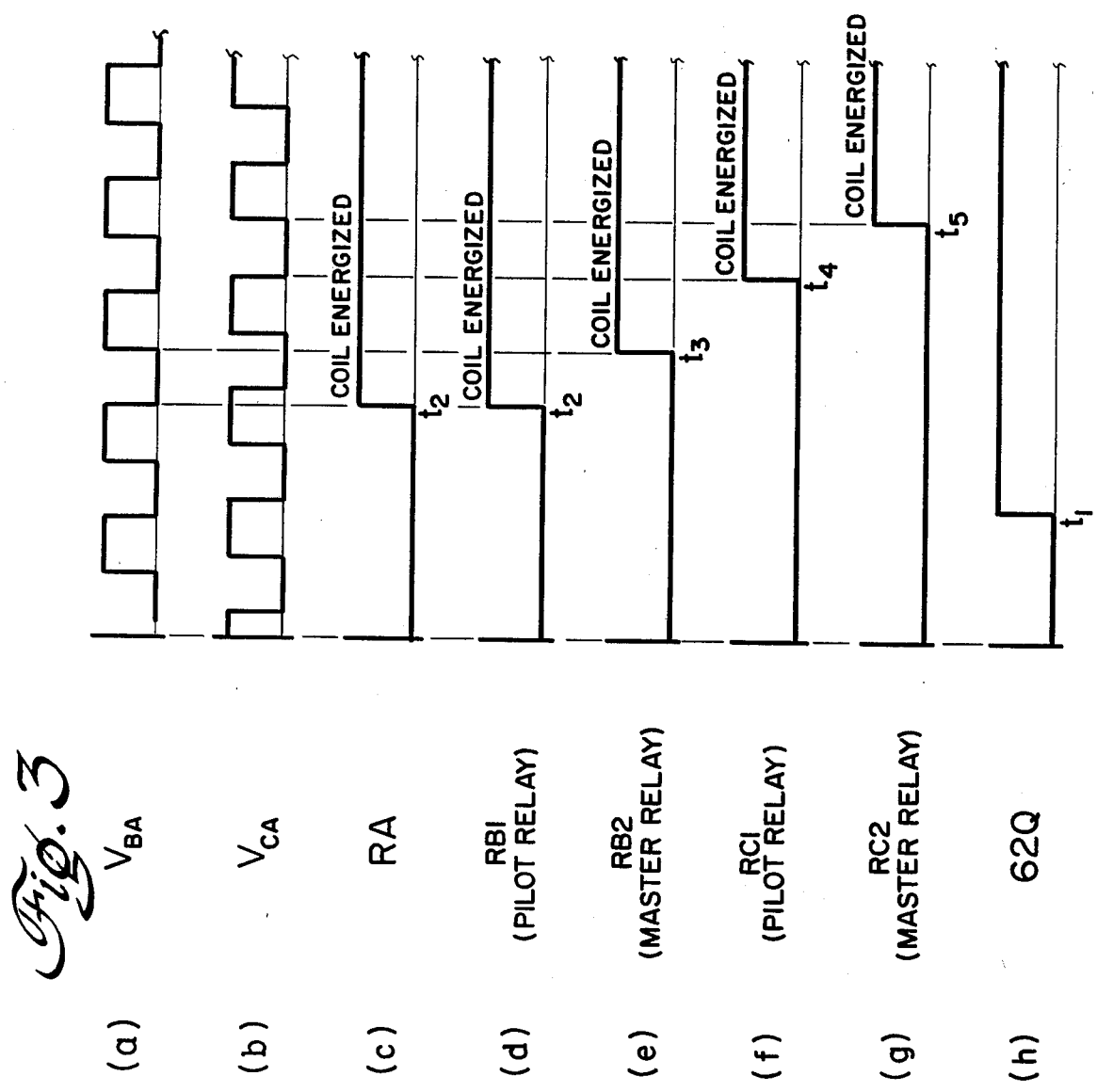

DIODE ASSISTED RELAY CONTACTOR

BACKGROUND OF THE INVENTION

1. Field of the Invention

The present invention relates to a method and apparatus for controlling the application of power to a load. More specifically, the present invention relates to the application of three phase power to a load, such as a motor, by way of a hybrid contactor system.

2. Description of the Prior Art

Conventional motor contactors must be designed to survive the arcing environment of making and breaking inductive loads of a three-phase, 60 hertz system. This arcing at the contacts leads to the use of double-break contact systems to provide sufficient withstand voltage for higher voltage, e.g. 460 V, operation. Also, large amounts of precious metals must be used to withstand the temperatures and the high rates of erosion at the arcing contacts. The high contact gaps and large contact erosion dictate a large air gap and a relatively inefficient magnetic structure with high power consumption required to drive the moving contacts.

A further problem is the constraint on system design due to the mechanical size and shape of the conventional electromagnetic contactor. The present electromechanical contactor is constrained to roughly a cubic shape where none of the dimensions are more than twice any other dimension. For a reversing contactor, two of these fully rated contactors must be used with a mechanical and/or electrical interlock to prevent short circuit conditions during the reversal of the motor.

To avoid the problems associated with conventional contactors, the use of hybrid contactors for providing loads with large amounts of current, is common. Generally, such hybrid contactors use a semiconductor device in parallel to a pair of relay contacts. The semiconductor device avoids or minimizes any arcing which would otherwise occur in the relay contacts. The arcing might otherwise cause degradation of the relay contacts and, eventually, necessitate the replacement of the relay. Moreover, the use of the semiconductor devices minimizes transient effects on the load caused by the bouncing of the relay contacts on either the make or break of a circuit and such hybrid contactor systems are shown for example by U.S. Pat. Nos. 3,466,503, issued to Goldberg; 3,446,991, issued to Howell; 3,504,233, issued to Hurtle; and 3,736,466, issued to Fox et al, all assigned to the assignee of the present invention. Another such hybrid contactor system is disclosed in the co-pending and commonly assigned application for "Relay Switching Apparatus" by Charles W. Eichelberger, Ser. No. 069,618, filed on Aug. 27, 1979 now U.S. Pat. No. 4,296,449 issued Oct. 20, 1981.

The use of commutated contacts is well documented in the literature. In general, the prior art relies upon the establishment of a voltage across the protective contacts before a three-terminal solid-state device is turned on to commutate the arc which is established at those contacts. A second area of prior art includes the basic concept of diode commutation of two series-connected relays as shown, for example, in the above-mentioned Goldberg patent and the above-mentioned Eichelberger patent application. Although the prior art diode commutation systems have been useful, they have generally required a large number of relays to provide both a complete ohmic break (i.e., on all 3 lines) between source and load and a reversing function.

SUMMARY OF THE INVENTION

In accordance with the invention, a switching circuit for controlling the flow of power from first, second, and third output lines of a three-phase AC power source to corresponding first, second, and third input lines of a load, includes: an ohmically-isolated pair of first-line relay contacts for directly, switchably connecting the first output line of the AC power source to the first input line of the load; a pair of second-line master relay contacts, shunted by a second-line diode, and attached in series with an ohmically-isolated pair of second-line pilot relay contacts for connecting the second output line of the AC power source to the second input line of the load; a pair of third-line master relay contacts, shunted by a third-line diode and attached in series with an ohmically-isolated pair of third-line pilot relay contacts for connecting the third output line of the AC power source to the third input line of the load; a detecting circuit for detecting a first relative waveform from at least two of the three output lines of the AC power source and generating a first indicating signal based on said first relative waveform; an input signal circuit for generating a START signal and a STOP signal; and a control circuit for controlling the state of all of the pairs of relays contacts. The control circuit is adapted to respond to the START signal by making the first line relay contacts before, or at the same time as, either one of the pairs of second-line pilot relay contacts and third-line pilot relay contacts makes. The pair of second-line pilot relay contacts make only when the second-line diode is reversed-biased by the AC power source. The pair of second-line master relay contacts make after the closing of the second-line pilot relay contacts and only when the second-line diode is forward biased by the AC power source; the pair of third-line pilot relay contacts are closed only when the third-line diode is reversed-biased by the AC power source. The pair of third-line master relay contacts make after the closing of the third-line pilot relay contacts and only when the third-line diode is forward biased by the AC power source. Additionally, a pair of second-to-third pilot relay contacts and a pair of third-to-second pilot relay contacts are used to realize a reversing function. The control circuit includes a phase-sequence detector and first, second, third and fourth flip flops associated respectively with the pair of second-line pilot relay contacts, the pair of second-line master relay contacts, the pair of third-line pilot relay contacts, and the pair of third-line master relay contacts. The flip flops are arranged as a tumble-down chain.

Accordingly, it is an object of the present invention to provide a system which makes and breaks a three-phase line-to-load connection in a non-arcing manner and still provides an ohmic break in the off condition.

Another object of this invention is to provide a hybrid contactor system using a minimum number of relays.

A further object of the present invention is to provide for a reversing function in a three-phase source-to-load switching circuit which uses only two extra relays for the reversing function.

A still further object of this invention is to minimize the size of the contacting system by allowing the use of small low-power (and low waste heat) relays, which relays assemblies need not be constrained to a cubic shape.

Yet another object of the present invention is to provide a motor starter which easily interfaces with logic level signals.

A still further object of the present invention is to provide a method and circuit for controlling the closing and opening of relays in a three phase hybrid contactor system.

Yet another object of the present invention is to provide a method and circuit for using the phase sequence to control the closing and opening of relays in a three phase hybrid contactor system.

These and other features of the present invention and the attendant advantages will be readily apparent to those having ordinary skill in the art and the invention will be more easily understood from the following detailed description of the preferred embodiments of the present invention taken in conjunction with the accompanying drawings wherein like reference characters represent like parts throughout the several views.

BRIEF DESCRIPTION OF THE DRAWINGS

FIGS. 2A and 2B are a circuit diagram for implementing the components shown as blocks in FIG. 1; and FIG. 3 is a timing diagram showing the sequence of operations in the system of FIGS. 1, 2A and 2B.

DETAILED DESCRIPTION OF THE PREFERRED EMBODIMENT

Figure 1:
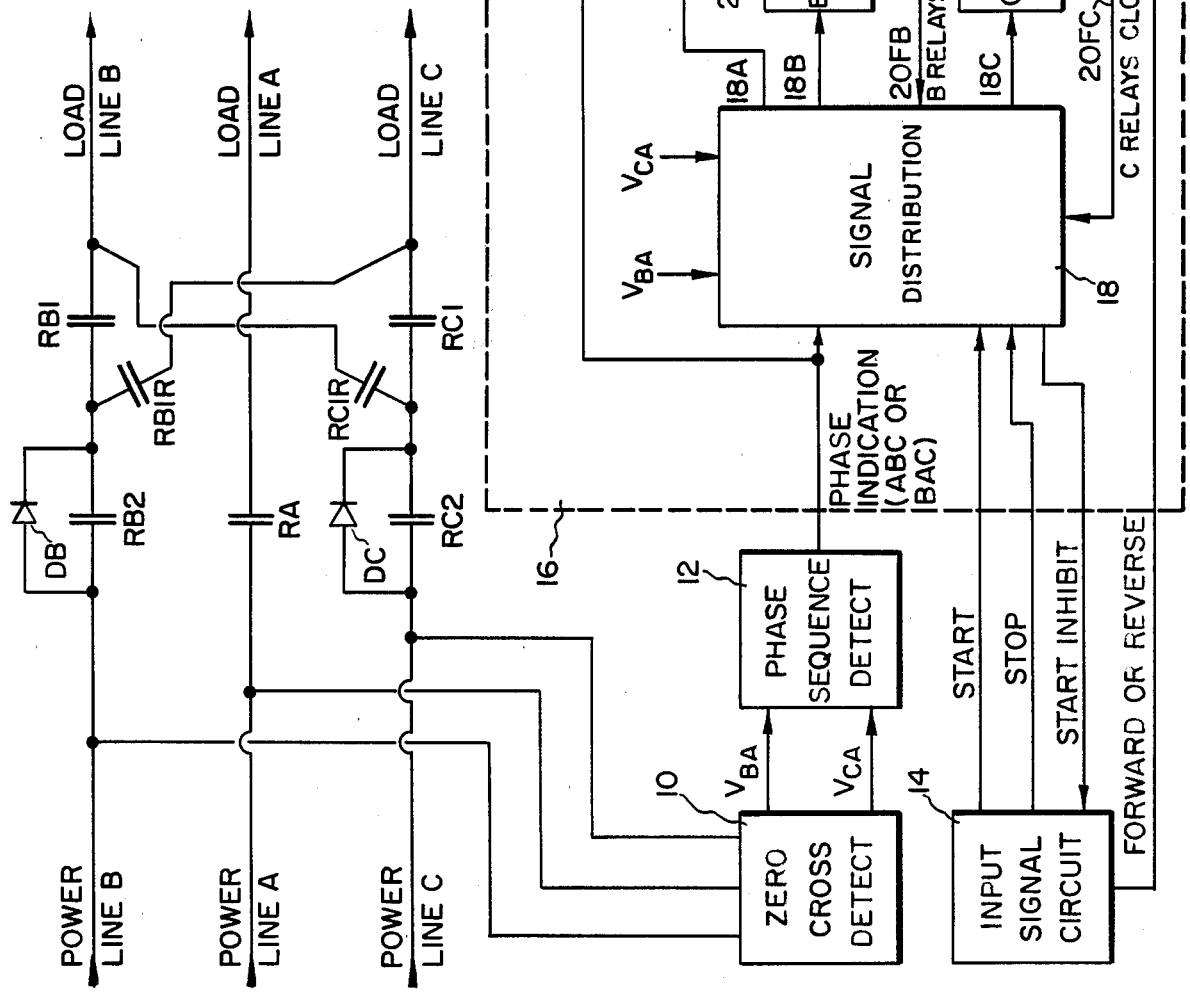
FIG. 1 is a block diagram of the switching circuit of the present invention.

With reference now to FIG. 1, there is shown a block diagram of the present improved diode assisted contactor system 1. Specifically, all of the shown components together constitute a switching circuit for switchably electrically connecting power line A, power line B, and power line C to load line A, load line B, and load line C. Each of the power lines carries a different phase signal from a three-phase AC power source (not shown). The three-phase AC power source will preferably, though not necessarily, provide three sine waves differing in phase by 120° on each of the three power lines. The load lines will be connected to a load, which may preferably be an AC motor, although other loads can of course be used. At least one pair of ohmically-isolated relay contacts is connected between each power line and the load line of the corresponding phase, thus providing complete (e.g. on all three lines) ohmic isolation between the source and the load. The relay contacts RA, RB1, and RC1 are themselves ohmically-isolated in the sense that they do not have any diode or other device shunting the contacts. That is, for example, no current can flow between power line A and load line A unless relay contacts RA make. The ohmically-isolated pairs of relay contacts RB1 and RC1 may be considered as pilot relay contacts which are respectively associated with the pairs of master relay contacts RB2 and RC2 to provide current paths respectively between power line B and load line B and between power line C and load line C. Respectively shunting the master relay contacts RB2 and RC2 are diodes DB and DC, each diode being used to prevent arcing on the make and break in a manner similar to that shown in the above-identified Goldberg patent. The relay contacts RA may be considered as a first line component, whereas diode DB, pilot relay contacts RB1, and master relay contacts RB2 are second-line components and diode DC, pilot relay contacts RC1, and master relay contacts RC2 may be considered as third-line components.

A pair of second-to-third line pilot relay contacts RB1R and a pair of third-to-second line pilot relay contacts RC1R provide for a reversing function, whereby the current from power line B may be fed to load line C and the current from power line C may be fed to load line B.

In order to properly time the making (establishing in a closed position) and breaking (establishing in an open position) of the relay contacts such that arcing is prevented, the signal on each of the three power lines is fed into zero cross detect circuit 10, which provides first and second indicating signals $V_{BA}$ and $V_{CA}$. The voltage waveforms $V_{BA}$ and $V_{CA}$ are functions of the zero crossings respectively between lines B and A and between line C and A. These voltage waveforms are fed into phase sequence detect circuit 12, which generates a phase indication output dependent on the phase sequence (ABC or BAC) of the three output lines of the AC power source. The signals $V_{BA}$ and $V_{CA}$, which respectively may be considered as first and second indicating signals, and the phase indication output are fed into a signal distribution circuit 18. Attached to signal distribution circuit 18 is an input signal circuit 14 which sends start and stop signals to signal distribution circuit 18 and receives a start inhibit signal from signal distribution circuit 18.

Signal distribution circuit 18 is part of a control circuit 16 shown in phantom lines and including other components which will be discussed in turn. Control circuit 16 is adapted to receive the start and stop signals from input signal circuit 14 and sequentially close or open the pairs of relay contacts such that arcing is prevented, or at least greatly minimized. The signal distribution circuit 18 provides outputs 18B and 18C, which are respectively fed into B flip flops 20B and C flip flops 20C. The B flip flops 20B and the C flip flops 20C provide outputs 20SB and 20SC which respectively control the state of the B relay coils (RB1, RB2, and RB1R) and C relay coils (RC1, RC2, and RC1R). Forward-reverse select circuits 22B and 22C receive a signal from input signal circuit 14 indicating whether the load should be powered in a forward direction (RB1 and RC1 are to be closed) or in a reverse direction (RB1R and RC1R are to be closed). Although the terminology "forward" and "reverse" is used throughout this application, it will be understood that this should not be taken to imply that the invention is only applicable to motors. Of course, the circuit is especially suited for controlling motors.

Feedback signals at lines 20FB and 20FC connect the outputs of the B flip flops 20B and the C flip flops 20C back to the signal distribution circuit 18. As will be discussed in more detail with respect to the schematic diagram of FIG. 2, the feedback signals on lines 20FB and 20FC allow for a "tumble down" flipping of the flip flops in 20B and 20C. "Tumble down" in this context means that the changing of state of one of the flip flops will cause a second flip flop to change state, which flip flop will in turn cause a third flip flop to change state, etc.

As will be evident from an inspection of FIG. 1, there is no need for any A flip flops, or a forward-reverse selector for the phase A (or first) line. This follows from the fact that, unlike the situation with respect to the phase B and phase C lines, the ohmically-isolated pair of first-line relay contacts RA directly connect power line A to load line A. "Directly" or "direct" means in this context, and throughout the present application, that there is no switching component (such as another pair of relay contacts) controlled to turn on and off at points dependent on the phase of a signal out of the AC source and which is electrically in between contacts RA and either power line A or load line A. That is, "directly" would exclude any relay contacts between RA and power line A or between RA and load line A, which are controlled to open and close responsive to a phase out of the AC power source. "Directly" would therefore not exclude the situation of a manually operated switch in between power line and relay contacts RA or in between load line A and relay contacts RA. Nor would this exclude a controlled switching element in series with relay contacts RA as long as the control of the switching element was independent of the phases of the signals coming out of the AC power source.

The simplicity of the connection between power line A and load line A by a single ohmically-isolated pair of relay contacts provides complete (on all three lines) ohmic isolation between the power supply and the load, while at the same time using a minimum number of relays. Additionally, relay contacts RA may be closed or opened by a signal appearing on line 18A out of signal distribution circuit 18 without the necessity of a flip flop dedicated to that relay. Alternately, relay contacts RA may be tripped or switched by a signal from the B flip flops 20B or C flip-flips 20C, the timing of which will be discussed in detail below.

It will be appreciated that the making of contacts RA establishes a two-way current conduction path between power line A and load line A, whereas the making of pilot contacts RB1 will establish only a one-way current conduction path (through diode DB) between power line B and load line B until RB2 makes to provide a two-way current path. The phase C components function the same as the phase B components in this respect.

Relay coils and drivers 24 preferably include a relay coil for each of the above discussed seven pairs of relay contacts RA, RB1, RB1R, RB2, RC1, RC1R and RC2. In addition to controlling the state of the relay contacts by energizing and de-energizing the corresponding relay coils, the relay coil and driver circuit 24 affects the speed of switching of some of the pairs of relay contacts based on the phase indication output, as will be discussed in more detail below.

Figure 2B:
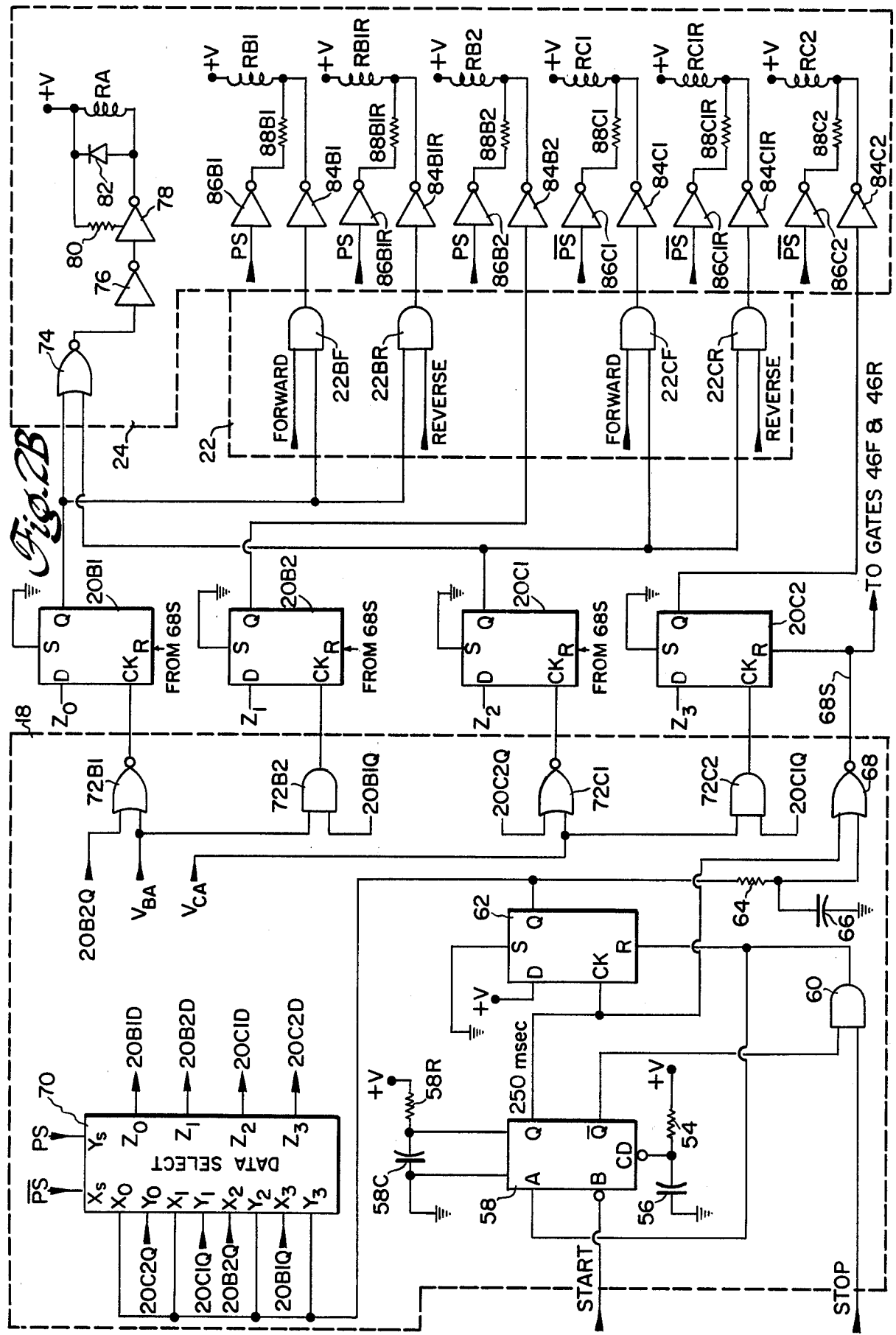

Turning now to FIGS. 2A and 2B, there is shown a schematic diagram for realizing the blocks of FIG. 1. Specifically, zero cross detect circuit 10 includes current limiting resistors 26B and 26C, and transistors 32B and 32C. Diodes 28B and 28C respectively protect transistors 32B and 32C from large reverse voltages. Pull-up resistors 30B and 30C provide a high input to respective inverters 34B and 34C except when the corresponding transistors 32B and 32C are turned on. The output of the Schmidt trigger inverter 34B is a first indicating signal $V_{BA}$ having a series of pulses, with each transition corresponding to a zero crossing in the relative voltage between line B and line A. Similarly, the output of Schmidt trigger 34C is a second indicating signal $V_{CA}$ which is a pulse train having each transition corresponding to a zero crossing in the relative voltage of power line C to power line A.

The phase-sequence detector 12 includes AND gate 36, which receives $V_{BA}$ and a start inhibit signal 68S. Second indicating signal $V_{CA}$ is fed into the D input of data type flip flop 38, whereas $V_{BA}$ is fed into the clock input of flip flop 38 by way of gate 36. The output of flip flop 38 depends on the relationship between $V_{BA}$ and $V_{CA}$, which in turn depends on the phase sequence on power lines A, B, and C. Accordingly, the output PS at Q of flip flop 38 will be low if the sequence is ABC and will be high if the sequence is BAC.

Input signal circuit 14 includes forward, reverse, and stop switches labeled respectively 40F, 40R, and 40S. The switches may be of the momentary contact type and, considering for example forward switch 40F, may be attached to resistor 42F and capacitor 44F which function as a debounce circuit. Each of switches 40F and 40R is connected as an input to respective NAND gates 46F and 46R. The other input for each of gates 46F and 46R is supplied with the start inhibit signal 68S. The outputs of gates 46F and 46R feed inputs on corresponding gates 48F and 48R, which constitute a flip flop. The output of gate 48F is fed into inverter 50F, the output of which is a FORWARD signal. The output of gate 48R is fed into inverter 50R, which generates a REVERSE signal at its output.

The outputs of gates 50F and 48R provide respective inputs to terminals A and B of one-shot (monostable multivibrator) 52 which will generate a 100 millisecond START pulse upon the closing of switch 40F or switch 40R. Timing resistor 52R and timing capacitor 52C are used for providing the 100 millisecond pulse out of one shot 52. Terminal CD of one shot 52 is used for clearing purposes at initial application of operating potential to the apparatus.

Stop switch 40S is connected to resistor 42S and capacitor 44S to provide an input to inverter 54, the output of which is used as a STOP signal.

The start pulse is fed into terminal B of one-shot (monostable multivibrator) 58, which generates a 250 millisecond pulse at its $\overline{Q}$ terminal. The Q output of one shot 58 is fed as an input to gate 60. the other input of which is connected to the STOP signal. The output of gate 60 is fed into terminal A of one shot 58 and reset terminal R of data flip flop 62. The output of the Q terminal of flip flop 62 is fed into NOR gate 68 by way of resistor 64 and capacitor 66. Additionally, the output at Q of flip flop 62 is fed into inputs $X_0$, $X_1$, $Y_2$, and $Y_3$ of a data select multiplexer 70. A second input of gate 68 is connected to the $\overline{Q}$ terminal of one shot 58. The output of gate 68 is a START INHIBIT signal 68S which serves to enable and disenable gates 46F and 46R. Additionally, START INHIBIT signal 68S is fed into the reset terminals of data type flip flops 20B1, 20B2, 20C1 and 20C2. The clock terminals of flip flops 20B1 and 20B2 are supplied with the first indicating signal $V_{BA}$ by way of NOR gate 72B1 and AND gate 72B2. A second input of gate 72B1 is connected to the Q output of flip flop 20B2 (denoted as 20B2Q). Likewise, a second input of gate 72B2 is connected to 20B1Q. The clock terminals of flip flops 20C1 and 20C2 are supplied with the second indicating signal $V_{CA}$ by way of NOR gate 72C1 and AND gate 72C2, the second inputs of these respective gates being connected to 20C2Q and 20C1Q.

The D inputs of flip flops 20B1, 20B2, 20C1 and 20C2 are respectively connected to the outputs Z0, Z1, Z2, and Z3 of data selector 70. Inputs $Y_0$, $Y_1$, $X_2$, and $X_3$ are respectively connected to the Q outputs of flip flops 20C2, 20C1, 20B2, and 20B1. The select terminals $X_s$ and $Y_s$ are respectively fed by signals PS and $\overline{PS}$. Data selecter 70 supplies either X or Y as the output word Z depending upon the input at the select terminals $X_s$ and $Y_s$.

The output at Q of flip flop 20B1 is used to drive either relay coil RB1 or relay coil RB1R depending upon whether the forward AND gate 22BF is enabled or the reverse AND gate 22BR is enabled. Inverter 84B1 is used to provide correct logical levels to the relay coil RB1. Inverter 86B1 and resistor 88B1 are used to vary the time delay from the switching of flip flop 20B1 to the making or breaking of the relay contacts RB1 corresponding to the relay coil RB1 dependent upon the presence or absence of signal PS. If PS is low, indicating a phase sequence of ABC, the relay contacts RB1 (only the relay coil of RB1, and not the relay contacts of RB1, is shown in FIG. 2B) will make or break approximately 30° (relative to first indicating signal $V_{BA}$) faster than if PS is high. The driving circuit for relay coils RB2, RC1, RC1R and RC2 is substantially the same, except that RB2 and RC2 do not require a forward or reverse gate and the $\overline{PS}$ signal is used to vary the switching time of relay contacts RC1, RC1R, and RC2.

The Q outputs of flip flops 20B1 and 20C1 are fed into NOR gate 74 to drive relay coil RA by way of inverters 76 and 78. Inverter 78 obtains its supply voltage by way of resistor 80 and, in the configuration shown having diode 82, will ensure that relay contacts RA (only the corresponding coil RA is shown in FIG. 2B) are always the first contacts to close and the last contacts to open.

Operation

Considering now the timing diagram of FIG. 3 in conjunction with the circuit of FIG. 2A and FIG. 2B, the operation of the present invention will be discussed. The timing diagram of FIG. 3 and the present discussion will proceed on the basis of a phase sequence of ABC, it being understood that the present invention, and specifically the phase sequence detect circuit 12, provides equally for operation where the power source has a phase sequence BAC. First and second indicating signals $V_{BA}$ and $V_{CA}$ are generated by zero detect circuit 10 and fed into phase sequence detect circuit 12, which in turn will output a low level or logical zero signal PS and its negation. The start inhibit signal 68S will normally be a logical 1 and, accordingly, will enable gates 46F and 46R and will maintain all flip flops 20B1, 20B2, 20C1 and 20C2 in a reset state (all Q outputs will be zero).

The discussion will proceed on the assumption that the forward switch 40F is closed, it being readily understood that the closing of reverse switch 40R will cause a similar sequence of events. Alternately, instead of closing switch 40F, a microprocessor or similar control system could be used to generate an input command signal. Following the closing of forward switch 40F, the flip flop (gates 48F and 48R) will cause the output of inverter 50F to go high and the output of gate 50R to go low. At the same time, one-shot 52 will generate a 100 millisecond START pulse which in turn causes one-shot 58 to generate a 250 millisecond pulse. The Q output of flip flop 62 will then go high as shown at time $t_1$ on timing diagram FIG. 3. The switching of the Q output of flip flop 62 into a high state will maintain the output of gate 68 in a low state, this output 68S having switched low during the 250 millisecond pulse out of one shot 58. Accordingly, the reset terminals of flip flops 20B1, 20B2, 20C1, and 20C2 will be low, thus allowing the outputs of these flip flops to be set by their D inputs.

Data select 70 will provide outputs Z0, Z1, Z2, and Z3 with the respective inputs X0, X1, X2, and X3 since $\overline{PS}$ will be high and PS will be low. If the phase sequence were BAC, instead of the assumed ABC, data select 70 would select the Y inputs. With the X inputs selected in the present case, Z0 and Z1 will provide high input signals to the respective D terminals of flip flops 20B1 and 20B2. Flip flop 20B1 will then be switched high when its clock terminal receives $V_{BA}$ by way of gate 72B1. A short time after the switching of flip flop 20B1 into a high state relay coils RA and RB1 will energized as at time $t_2$, it being recalled that relay coil RA may actually be energized at any time before energizing relay coil RB1 as long as relay contacts RA make before, or at the same time as, the making of contacts RB1. Because the Q output of flip flop 20B1 is now high, gate 72B2 will now be enabled, thus clocking flip flop 20B2 into a high state and energizing relay coil RB2 at time $t_3$.

Following the flipping of flip flops 20B1 and 20B2, data select 70 will provide the D inputs of flip flops 20C1 and 20C2 with high signals at Z2 and Z3, corresponding to the respective outputs of 20B2 and 20B1. Next, flip flop 20C1 will be clocked by second indicating signal $V_{CA}$ by way of gate 72C1. Flip flop 20C1 will thus be high, thereby driving relay coil RC1 as at time $t_4$ of FIG. 3. Once the Q output of flip flop 20C1 is switched high, gate 72C2 will be enabled, thereby allowing second indicating signal $V_{CA}$ to clock flip flop 20C2 into a high state. This in turn will cause relay coil RC2 to be energized as at time $t_5$. First, second, third and fourth flip flops are thus drivingly connected with relays RB1, RB2, RC1, and RC2.

Having discussed the sequence of operations of a FORWARD power up, it will be readily apparent that the same sequence of events will occur in a REVERSE power up except that relays RB1R and RC1R will be energized instead of relays RB1 and RC1. Additionally, if the phase sequence were BAC, data select 70 will turn on relays RC1 and RC2 before turning on relays RB1 and RB2.

The operation of the circuit on turn off, or power down, is generally similar to the operation on power up except that the order of switching of the relays is different. Assuming once again that the motor or other load is being powered in a forward condition and that the phase sequence is ABC, the power down sequence of events will be briefly discussed. Upon the closing of switch 40S, flip flop 62 will be reset as at time $t_6$ of FIG. 3. The Q output of flip flop 62 will thus provide low, or logical zero, signals to data select 70, which in turn will provide low inputs to the D terminals of flip flops 20B1 and 20B2. Note that resistor 64 and capacitor 66 prevent gate 68 from instantly resetting flip-flops 20B1, 20B2, 20C1, and 20C2. Next, flip flop 20B2 is switched low when clocked by signal $V_{BA}$ by way of gate 72B2. When the Q output of flip flop 20B2 switches low, relay RB2 will be de-energized as at time $t_7$. The next transition in first indicating signal $V_{BA}$ will cause flip flop 20B1 to be clocked low, thereby de-energizing relay RB1 as at time $t_8$. The D inputs to flip flops 20C1 and 20C2 will now be low, as provided by data select 70. Accordingly, second indicating signal $V_{CA}$ will clock flip flops 20C2 and 20C1 into low states at the respective times $T_9$ and $T_{10}$ at which times the respective relays RC2 and RC1 will be de-energized. Additionally, the switching low of output Q of flip flop 20C will cause relay coil RA to be de-energized as indicated at time $T_{10}$ of FIG. 3. Alternately, relay RA could be de-energized at any time after the de-energization of pilot relay RC1 at time $T_{10}$, the important consideration being that relay contacts RA break after, or at the same time as, the breaking of contacts RC1.

Flip flops 20B1, 20B2, 20C1 and 20C2 would preferably be edge-triggered flip flops. Additionally, first, second, third, and fourth flip flops 20B1, 20B2, 20C1 and 20C2 are arranged as a tumble-down chain of flip flops, meaning that the flipping (changing of output Q) of one flip flop will cause the flipping of another flip flop, until all four flip flops have tripped. For example, in the power-up sequence discussed above, the tripping of flip flop 20B1 will cause flip flop 20B2 to flip, which in turn flips flip flop 20C1. The flipping of flip flop 20C1 will then cause flip flop 20C2 to flip. For the phase sequence ABC and as discussed with respect to time diagram FIG. 3, the flipping of the flip flops on power down occurs in the sequence of 20B2, 20B1, 20C2 and 20C1. It will be appreciated that the order or sequence of flipping of these flip flops is thus different on flipping or changing state from high to low than from low to high. Moreover, the order will of course depend upon the phase sequence information provided to data select 70.

Referring now to table 1, and considering FIG. 2B and timing chart FIG. 3, the operation of relay coils and drivers 24 will be discussed. As shown by table 1, there is a delay from when a relay coil is actuated until the corresponding contacts actually make. For example, considering relay RB1, the energizing of the coil at the 180° point will cause the contacts to make at about the 270° point, these phase angles being taken relative to the first indicating signal $V_{BA}$. The parenthetical values indicate the phase window available to open or close the particular contact without having arcing. The pick-up delay (angle of making minus angle of relay actuation) will be 90° for relays RB1 and RB2. In contrast, and because of the signals PS and $\overline{PS}$, the pick-up delay for relays RC1 and RC2 will be 120°. Likewise, the drop-out delay will be different for the B relays than for the C relays. Note that if the phase sequence were BAC the pick up and drop-out delays would be longer for the B relays, instead of the C relays. The phase information, as provided to inverter 86B1 and the similar inverters, will thus effect the speed of pick-up delay and drop-out delay, thereby ensuring that the contacts open or close within the proper phase window depending upon the phase sequence information. Note that relay RA is not listed in table one, it being understood that relay RA is energized just before, or at the same time as, the energizing of the first pilot relay (RB1 or RC1). Relay RA is de-energized just after, or at the same time as, the de-energizing of the last pilot relay to be de-energized.

TABLE 1:

Phase angles in degrees relative to $V_{BA}$ for phase sequence ABC with phase windows in parenthesis.

Motor Powered Up

| Relay | Desired Phase Angle Contact Closed | Pick-up Delay | Phase Angle Relay Actuated |
|---|---|---|---|
| RB1 | 270(±90) | 90 | 180 |
| RB2 | 450(±90) | 90 | 360 |
| RC1 | 720(±90) | 120 | 600 |
| RC2 | 900(±90) | 120 | 780 |

Motor Powered Down

| Relay | Desired Phase Angle Contact | Drop-Out | Phase Angle Relay |

TABLE 1:-continued

Phase angles in degrees relative to $V_{BA}$ for phase sequence ABC with phase windows in parenthesis.

| Relay | Opened | Delay | Actuated |
|---|---|---|---|
| RB1 | 285(±45) | 105 | 180 |
| RB2 | 105(±45) | 105 | 0 |
| RC1 | 735(±30) | 135 | 600 |
| RC2 | 555(±45) | 135 | 420 |

Referring now to FIG. 1 in conjunction with the timing diagram of FIG. 3, the sequence of making and breaking of the relay contacts will be discussed relative to Table 1. Specifically, the relay coils are actuated at angles such that relay contacts RA will make first followed by or at the same time as, the making of relay contacts RB1, which making occurs only when diode DB will be reversed biased. Next, relay RB2 will be closed when diode DB is forward biased. Relay RC1 will then make when diode DC will be reverse biased, followed by the making of master relay RC2 when diode DC is forward biased. Upon the input signal circuit 14 providing a stop signal, master relay RB2 will break when diode DB will be forward biased, followed by the breaking of relay contacts RB1 when diode DB is reverse biased. Relay contacts RC2 will break when diode DC will be forward biased, followed by the breaking of relay contacts RC1 when diode DC is reverse biased. After, or at the same time as, the breaking of relay RC1 the relay contacts RA will break.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method of switchably connecting and disconnecting first, second and third output lines of a three-phase AC power source to first, second and third input lines of a load, the steps comprising:
I. turning on a flow of power from said AC power source to said load by:
   (a) making an ohmically-isolated pair of first-line relay contacts, to establish a direct two-way current conduction path between said first output line of said AC power source and said first input line of said load;
   (b) making an ohmically-isolated pair of second-line pilot relay contacts after, or at the same time as, step I(a), to establish a one-way current conduction path through a second-line diode between said second output line of said AC power source and said second input line of said load, the second-line pilot relay contacts making only when the second-line diode is reversed-biased by said AC power source;
   (c) making a pair of second-line master relay contacts shunted by, and associated with, said second-line diode after step i(b) and only when the second-line diode is forward biased by said AC power source, to establish a two-way current conduction path between said second output line of said AC power source and said second input line of said load;
   (d) making an ohmically-isolated pair of third-line pilot relay contacts after, or at the same time as, step I(a), to establish a one-way current conduction path through a third-line diode between said third output line of said AC power source and said third input line of said load, the third-line pilot relay contacts making only when the third-line diode is reverse biased by the AC power source; and (e) making a pair of third-line master relay contacts shunted by, and associated with, said third-line diode after step I(d) and only when the third-line diode is forward biased by said AC power source, to establish a two-way current conduction path between said third output line of said AC power source and said third input line of said load; and II. turning off the flow of power from said AC power source to said load by:

(a) breaking one of said pairs of second-line and third-line master relay contacts when the associated shunting diode is forward biased by the AC power source;

(b) breaking the pair of pilot relay contacts associated with the master relay contacts of step II(a) after step II(a) and only when the associated line diode is reverse biased;

(c) breaking the other one of said pairs of second-line and third-line master relay contacts only when the associated line diode is forward biased by the AC power source; source;

(d) breaking the other one of said pairs of pilot relay contacts after step II(c) and only when the associated line diode is reverse biased;

(e) breaking the pair of first-line relay contacts after, or at the same time as, the last occuring of steps II(b) and II(d).

2. The method of claim 1 further including the steps of detecting a first relative waveform from at least two of said output lines of said AC power source; generating a first indicating signal based on said first relative waveform; using said first indicating signal to control the timing of the making of at least one of said pairs of pilot relay contacts and at least one of said pairs of master relay contacts; and using said first indicating signal to control the timing of the breaking of at least one of said pairs of pilot relay contacts and at least one of said pairs of master relay contacts.

3. The method of claim 2 further including the steps of detecting a second relative waveform from at least two of said three output lines of the AC power source, said second relative waveform having a phase difference with respect to said first relative waveform; generating a second indicating signal based on said second relative waveform; using said second indicating signal to control the timing of the making of at least one of said pairs of pilot relay contacts and at least one of said pairs of master relay contacts; and using said second indicating signal to control the timing of the breaking of at least one of said pairs of pilot relay contacts and at least one of said pairs of master relay contacts.

4. The method of claim 3 wherein each detected relative waveform is a relative voltage waveform, and each indicating signal is derived from detecting zero-crossings of a relative voltage waveform.

5. The method of claim 3 wherein the first indicating signal controls the timing of the making and breaking of one of said pairs of pilot relay contacts, and an associated one of said pairs of master relay contacts; and the second indicating signal controls the timing of the making and breaking of the other one of said pairs of pilot relay contacts, and the other one of said pairs of master relay contacts.

6. The method of claim 5 further comprising the steps of: providing a triggering signal responsive to each of said first and second indicating signals; providing a tumble-down chain of a plurality of flip-flops, each of the flip-flops in the tumble-down chain being associated with one of said pairs of second-line and third-line relay contacts; and changing the state of a flip-flop in said tumble-down chain of flip-flops to cause each of the making and breaking of a pair of second-line or third-line relay contacts.

7. The method of claim 5 wherein each detected relative waveform is a relative voltage waveform, and each indicating signal is derived from detecting zero-crossings of a relative voltage waveform; and the steps of turning on the flow of power include the following steps in order: I(b), I(c), I(d) and I(e); and the steps of turning off the flow of power include the following steps in order: II(a), II(b), II(c), and II(d).

8. The method of claim 7 further comprising the step of: breaking the pair of second-line master relay contacts prior to breaking the pair of third-line master relay contacts.

9. The method of claims 2, 3 or 5 further including the steps of detecting the phase sequence of voltage waveforms on the three output lines of said AC power source; and controlling the timing of the making and breaking of the pairs of second-line and third-line relay contacts based on the phase sequence detected.

10. The method of claim 1 or 2 further comprising the steps of: providing a triggering signal whenever said flow of power is to be turned on or turned off; providing a tumble-down chain of flip-flops triggered by said first indication signal; and controlling the making and breaking of at least two of said pairs of relay contacts responsive to the sequential flipping of at least two flip-flops in said tumble-down chain of flip-flops.

11. A switching circuit system for controlling the flow of power from first, second, and third output lines of a three-phase AC power source to first, second, and third input lines of a load, comprising:

an ohmically-isolated pair of first-line relay contacts for directly, switchably connecting the first output line of the AC power source to the first input line of the load;

a pair of second-line master relay contacts shunted by a second-line diode and attached in series with an ohmically-isolated pair of second-line pilot relay contacts for switchably connecting the second output line of the AC power source to the second input line of the load;

a pair of third-line master relay contacts shunted by a third-line diode and attached in series with an ohmically-isolated pair of third line pilot relay contacts for connecting the third output line of the AC power source to the third input line of a load;

a detecting circuit for detecting a first relative waveform from at least two of said output lines of said AC power source and generating a first indicating signal based on said first relative waveform;

an input signal circuit for generating at least a START signal; and a control circuit for controlling the state of all of said pairs of relay contacts and which receives said first indicating signal and said start signal, said control circuit including means responding to the START signal for:

making said first-line relay contacts before, or at the same time as, either one of said pair of second-line pilot relay contacts and said pair of third-line pilot relay contacts makes;

making said pair of second-line pilot relay contacts only when the second-line diode is reverse biased by the AC power source; making said pair of second-line master relay contacts after the making of the second-line pilot relay contacts and only when the second-line diode is forward biased by the AC power source; and making said pair of third-line pilot relay contacts only when the third-line diode is reverse biased by the AC power source; and making said pair of third-line master relay contacts after the making of the third-line pilot relay contacts and only when the third-line diode is forward biased by the AC power source.

12. The circuit system of claim 11, wherein said input signal circuit also generates a STOP signal; said control circuit also receives said STOP signal and further includes means responding to said STOP signal for:

breaking said second-line master relay contacts only when the second-line diode is forward biased by the AC power source;

breaking said second-line pilot relay contacts after the breaking of the second-line master relay contacts and only when the second-line diode is reverse biased by the AC power source;

breaking said third-line master relay contacts only when the third-line diode will be forward biased by the AC power source;

breaking said third-line pilot relay contacts after the breaking of the third-line master relay contacts and only when the third-line diode is reverse biased by the AC power source; and breaking said first-line relay contacts after, or at the same time as, the last to break of said second-line and third-line pilot relay contacts.

13. The circuit system of claim 12 wherein the detecting circuit includes means for detecting the first relative waveform between the first and second output lines of said AC power source; means for detecting a second relative waveform between the first and third output lines of the AC power source; and means for generating a second indicating signal based on said second relative waveform, the second indicating signal being coupled to the control circuit.

14. The circuit system of claim 12 or 13 wherein the switching circuit further includes a phase-sequence detector having a phase indication output dependent on the phase sequence of the three output lines of the AC power source, and the phase indication output controls the order in which the pairs of relay contacts make and break.

15. The circuit system of claim 12, wherein the control circuit further includes: a first-line relay coil controlling said pair of first-line relay contacts; a second-line pilot relay coil controlling said pair of second-line pilot relay contacts; a second-line master relay coil controlling said pair of second-line master relay contacts; a third-line pilot relay coil controlling said pair of third-line pilot relay contacts; and a third-line master relay coil controlling said pair of third-line master relay contacts.

16. The circuit system of claim 15 wherein the control circuit further includes four flip-flops connected in a tumble-down chain and each flip-flop has an output connected to drive at least one of said second-line and third-line relay coils.

17. The circuit system of claim 16 wherein the control circuit further includes data selector means for connecting the four flip-flops in the tumble-down chain responsive to a phase indication signal to cause the flip-flops to tumble from a high state to a low state in a first order or from a low state to a high state in a second order, different from said first order, responsive to the state of said phase indication signal.

18. The circuit system of claim 17 wherein the switching circuit further includes a phase sequence detector having an output providing said phase indication signal dependent on the phase sequence of the three output lines of the AC power source, said phase indication signal being coupled to said selector means to control the order in which the pairs of relay contacts make and break by controlling the order of tumbling of the flip-flops.

19. The circuit system of claim 18 wherein the the data selector means selectively supplies one of two input words to inputs of said flip-flops, the input word selected being dependent on the state of the phase indication signal; and an output of each of the four flip-flops is supplied as at least a portion of the input word to said data selector means.

20. The circuit system of claim 16 or 19 wherein the detecting circuit detects the first relative waveform from the first and second output lines of said AC power source for generating said first indicating signal and also detects a second relative waveform from the first and third output lines of the AC power source for generating a second indicating signal based on said second relative waveform, said second indicating signal being coupled to the control circuit; and wherein two of the flip-flops are clocked by said first indicating signal and the other two flip-flops are clocked by the second indicating signal.

21. The circuit system of claim 15 wherein the switching circuit further includes:

an ohmically-isolated pair of second-to-third line pilot relay contacts and an associated second-to-third line pilot relay coil in said control circuit, and an ohmically-isolated pair of third-to-second line pilot relay contacts and an associated third-to-second line pilot relay coil in said control circuit;

said input signal circuit generates a REVERSE signal which causes said control circuit to respond to the START signal by:

making said first-line relay contacts before, or at the same time as, either one of said pair of second-to-third line pilot relay contacts and third-to-second line pilot relay contacts makes;

making said pair of second-to-third line pilot contacts only when the second-line diode is reverse biased by the AC power source;

making said pair of second-line master relay contacts after the making of the second-to-third line pilot relay contacts and only when the second-line diode is forward biased by the AC power source;

making said pair of third-line pilot relay contacts only when the third-line diode is reverse biased by the AC power source; and making said pair of third-liner master relay contacts after the making of the third-line pilot relay contacts and only when the third-line diode is forward biased by the AC power source; and to respond to said STOP signal by:

breaking said second-line master relay contacts only when the second-line diode is forward biased by the AC power source;

breaking said second-to-third line pilot relay contacts after the breaking of the second-line master relay contacts and only when the second-line diode is reverse biased by the AC power source;

breaking said third-line master relay contacts only when the third-line diode is forward biased by the AC power source;

breaking said third-to-second line pilot relay contacts after the breaking of the third-line master relay contacts and only when the third-line diode is reverse biased by the AC power source; and breaking said first line relay contacts after, or at the same time as, the last to break of said second-to-third line and third-to-second line pilot relay contacts.

22. The circuit system of claim 21 wherein the control circuit further includes:

a first flip-flop connected to selectively drive said second-line pilot relay coil and said second-to-third line pilot relay coil;

a second flip-flop connected to drive said second-line master relay coil;

a third flip-flop connected to selectively drive said third-line pilot relay coil and said third-to-second line pilot relay coil; and a fourth flip-flop connected to drive said third-line pilot relay contacts;

the four flip-flops being connected in a tumble-down chain such that the order of tumbling of the flip-flops is different depending on whether the flip-flops are tumbling from a high state to a low state or from a low state to a high state.

23. The circuit system of claim 22 wherein the switching circuit further includes a phase sequence detector having a phase indication output dependent on the phase sequence of the three output line of the AC power source, said phase indication output controlling the order in which the pairs of relay contacts make and break by controlling the order of tumbling of the flip-flops; and the detecting circuit detects the first relative waveform from the first and second output lines of said AC power source and also detects a second relative waveform from the first and third output lines of the AC power source to generate a second indicating signal based on said second relative waveform; said second indicating signal being coupled to the control circuit; and wherein two of the flip-flops are clocked by said first indicating signal and the other two flip-flops are clocked by the second indicating signal.

24. The circuit system of claim 23, further including means for varying the time delay of making and breaking at least one of the second and third pilot and master relay contactors, dependent upon the phase sequence detected.

25. The circuit system of claim 22 wherein the control circuit further includes a data select circuit for selectively supplying one of two input words to inputs of said flip-flops, the input word selected depending on the phase indication output; and outputs of each of the four flip-flops is supplied as an input to said data select circuit.

* * * * *